United States Patent [19]

Yokota et al.

[11] 4,420,694
[45] Dec. 13, 1983

[54] MUTING CIRCUIT

[75] Inventors: Teppei Yokota, Funabashi; Yoshiro Joichi, Tokyo, both of Japan

[73] Assignee: Sony Corporation, Tokyo, Japan

[21] Appl. No.: 285,839

[22] Filed: Jul. 22, 1981

[30] Foreign Application Priority Data

Jul. 28, 1980 [JP] Japan .............................. 55-103321

[51] Int. Cl.$^3$ .............................................. H01H 7/16
[52] U.S. Cl. ................................ 307/130; 307/141; 455/212
[58] Field of Search ............. 307/130, 141, 64, 141.4; 330/51; 455/212, 218, 221, 222, 225

[56] References Cited

U.S. PATENT DOCUMENTS 3,390,275 6/1968 Baker ................................... 307/64
3,876,945 4/1975 Gossel ................................ 455/212
4,204,149 5/1980 Cleary et al. ..................... 307/141.4
4,336,464 6/1982 Weber ............................... 307/141.4
4,338,562 7/1982 Terwilliger ........................ 307/141

FOREIGN PATENT DOCUMENTS 52-9361 1/1977 Japan .................................. 307/130

Primary Examiner—Elliot A. Goldberg
Assistant Examiner—Todd E. De Boer
Attorney, Agent, or Firm—Hill, Van Santen, Steadman & Simpson

[57] ABSTRACT

Disclosed is a muting circuit, in which the generation of click noise is prevented in that the muting operation is caused to occur at an instant when the instantaneous level (i.e., waveform level) of the input audio signal becomes zero for the first time since the appearance of a muting signal.

2 Claims, 5 Drawing Figures

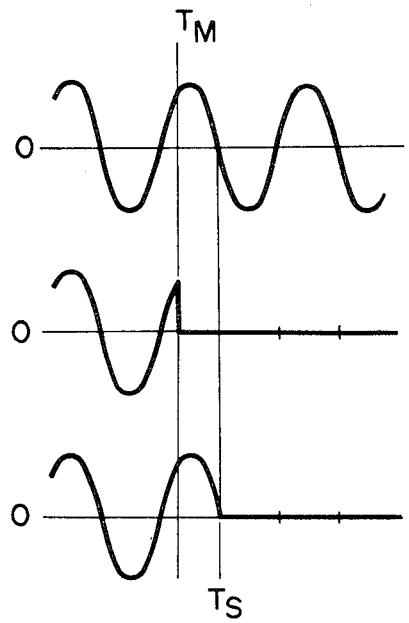
FIG.1A PRIOR ART
FIG.1B PRIOR ART
FIG.1C PRIOR ART
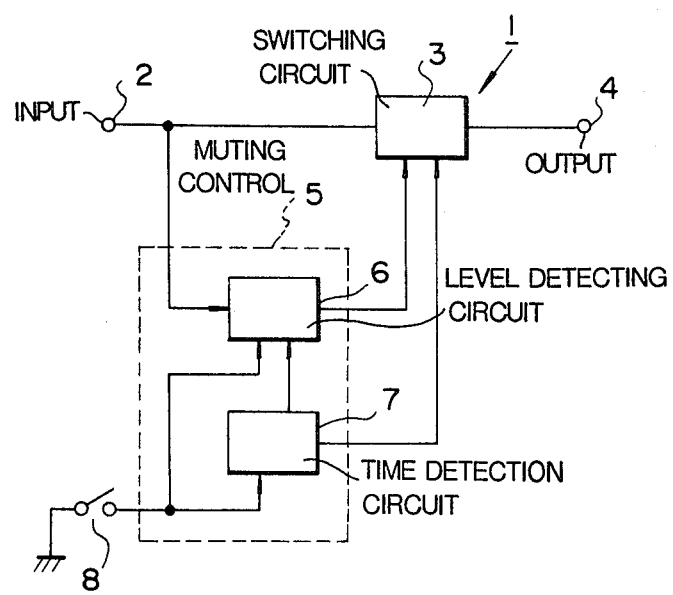
FIG.2

MUTING CIRCUIT

BACKGROUND OF THE INVENTION

1. Field of the Invention

This invention relates to a muting circuit for temporarily muting an audio signal according to a muting operation and, more particularly, to a muting circuit in which such noise as click sounds that may otherwise accompany the switching operation for muting are eliminated.

2. Description of the Prior Art

The muting circuit is generally used for such purposes as deleting commercial announcements or commentary inserted between consecutive pieces of music, for instance, when recording an FM music program. In a well-known muting circuit, a switch is connected between the audio signal input and the output terminals and is turned on-off according to a muting signal.

In such a prior art muting circuit, however, the switch is turned on-off simultaneously with the appearance of the muting signal (or level change thereof), that is, the audio signal is muted and demuted even when the waveform level of the audio signal (i.e., instantaneous amplitude thereof) is not at a zero level, thus giving rise to noises such as click sounds.

SUMMARY OF THE INVENTION

An object of the present invention is to provide an improved muting circuit which can overcome the aforedescribed drawback inherent in the prior art.

A more specific object of the present invention is to provide a muting circuit, in which the generation of the aforementioned noise is prevented in that the switching operation for muting is brought about at an instant when the instantaneous level of the audio signal waveform becomes zero.

A further object of the present invention is to provide a muting circuit, in which the switching operation is forcibly effected for muting in case the aforementioned zero level is not detected within a fixed period of time from the instant of change of the muting signal.

To attain the above objects, the muting circuit according to the present invention includes a muting control circuit, which controls the on-off operation of a switching circuit connected between an input terminal and an output terminal according to a muting signal, more particularly it detects the waveform level of the input audio signal and causes the switching operation of the switching circuit according to the muting signal at an instant when the waveform level approaches a zero level. The muting control circuit may also be adapted to cause the switching operation of the switching circuit on the basis of the relationship between the time elapsed from the instant of change of the muting signal and the input signal waveform level.

The above and other objects, features and effects of the present invention will become more apparent from the following detailed description of the present invention and accompanying drawings.

BRIEF DESCRIPTION OF THE DRAWINGS

FIGS. 1A to 1C show a time chart illustrating the relation between input audio signal and muted output audio signal;

FIG. 2 is a block diagram showing a first embodiment of the present invention.

DETAILED DESCRIPTION OF THE PREFERRED EMBODIMENT

Figure 3:
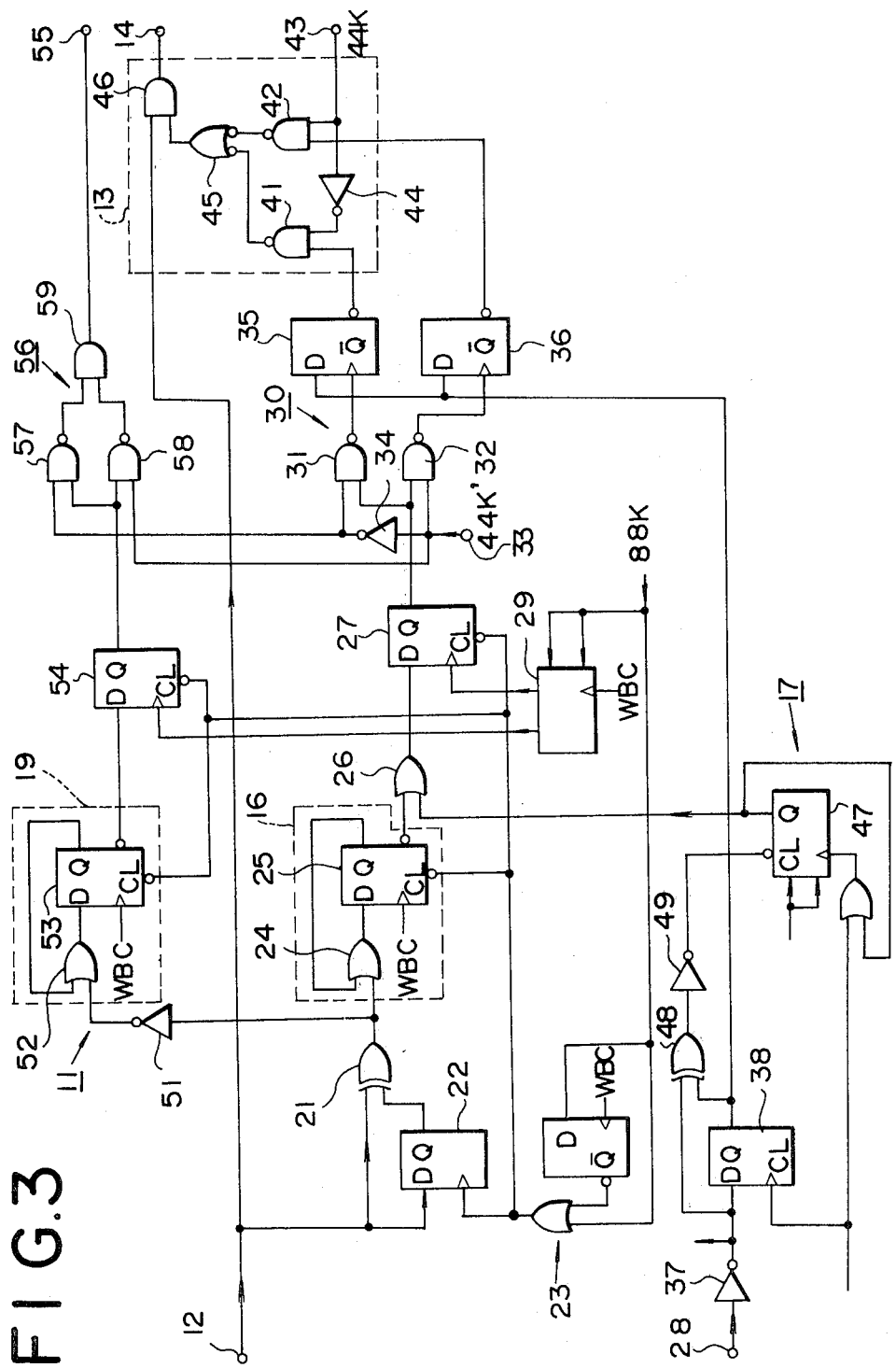
FIG. 3 is a circuit diagram showing a second embodiment of the present invention.

FIGS. 1A to 1C show the relation between input audio signal and muted output audio signal. When muting is effected on the input audio signal as shown in FIG. 1A at an instant when the waveform of the input signal does not cross the zero axis, such as at an instant $T_M$, the output audio signal from a prior art muting circuit is suddenly reduced to the zero level at the instant $T_M$ as shown in FIG. 1B. Therefore, the waveform becomes discontinuous, thus resulting in click noises.

This invention has been intended to prevent such a sudden change of the waveform by permitting the muting to be effected in effect at the instant $T_S$, at which time the level of the input signal waveform itself becomes zero immediately after the instant $T_M$, as shown in FIG. 1C.

FIG. 2 shows a block form of the basic construction of a first embodiment of the present invention. In FIG. 2, an audio signal supplied to an input terminal 2 of the muting circuit 1 is fed through a switching circuit 3 for muting to an output terminal 4. The input signal appearing at the input terminal 2 is also supplied to a level detecting circuit 6 in a muting control circuit 5. In the instant embodiment, the muting control circuit 5 includes a level detection circuit 6 and a time detection circuit 7. A muting signal from a manually operable switch 8 is supplied to the level detection circuit 6 and time detection circuit 7. For example, when effecting the muting, the switch 8 is turned on to provide a muting signal of "L" (low level). When releasing the muting, it is turned off to provide a "H" (high level) muting signal.

The level detection circuit 6 detects the level of the audio input signal waveform (instantaneous crest value) at the time of the aforementioned muting, and when the level approaches the zero level, for instance becomes less than $-60$ dB, it supplies the muting control signal to the switching circuit 3 to render the circuit 3 into a cut-off state. Thus, if the muting mode is brought about in the presence of the audio input signal at the input terminal 2 as shown in FIG. 1A, for instance at the instant $T_M$, the switching circuit 3 is turned off at an instant $T_S$ when the waveform of FIG. 1A is substantially zero. In consequence, an output signal as shown in FIG. 1C is provided from the output terminal 4. In this way, the generation of noise such as click noises can be prevented.

In case where the input signal to the input terminal 2 is an audio signal or the like obtained through a direct current amplifier, the reference level is likely to deviate from the ground level. In such a case, it is likely that the instantaneous level at each point of the signal waveform is not at a zero level in the case when the input signal level is low. At the instantaneous level which is other than zero, the switching circuit 3 is not turned off even when the muting mode occurs. To preclude this inconvenience, according to the present invention the time detection circuit 7 is provided within the muting control circuit 5. This time detection circuit 7 is adapted to provide a muting control signal to the switching circuit 3 to forcibly turn off the switching circuit 3 after the lapse of a constant period of time, for instance 100 msec., from the instant of a change of the muting signal from the switch 8, for instance from the "H" to the "L"

level. With this arrangement, the muting operation, i.e., the turning-off of the switching circuit 3, is effected even if the zero level is not detected due to causes such as variations of the reference level of the input audio signal.

While the above description has been for the case of muting, that is, bringing about the muting mode, in the case of releasing the muting (i.e., muting-off), the audio signal also appears from the output terminal 4 from the instant when the input signal waveform crosses zero level, and also the muting is forcibly released after a constant period of time.

Further, the detection level may be increased from zero level with the lapse of time from the instant of change of the muting signal. In such a case, the muting operation can be effected even at a high level such that some time elapses. Further, the muting can be readily accomplished at desired levels and times.

FIG. 3 shows a block diagram of a second embodiment of the present invention applied to a muting circuit 11 for muting a digital audio signal such as a PCM audio signal. In FIG. 3, a PCM audio signal, for instance with each word of 14 bits, is supplied to the input terminal 12. Here, a single amplitude value when an analog audio signal is sampled under the control of a predetermined sampling signal (for instance at 44 kHz) corresponds to one word, and this amplitude value is converted into a 14-bit data, for instance by the method of displaying the complement of 2, to provide the PCM signal where one word consists of 14 bits. This PCM audio signal of the embodiment is a serial data signal where left and right channel data of a stereo audio signal are alternately arranged one word after another on the time axis by alternately sampling the left and right channels of the signal, only the data of either left or right channel can be taken out through gating control with, for instance, a signal at the sampling frequency (for instance 44 kHz) and at a duty ratio of 50%.

The PCM audio signal supplied as an input signal to the input terminal 12 is coupled through the switching circuit 13 for muting to the output terminal 14. The input signal is also coupled through an exclusive OR circuit (hereinafter referred to as Ex.OR circuit) 21 to a level detection circuit 16. To the other input terminal of the Ex.OR circuit 21 is supplied the Q output from a latch circuit which uses, for instance, a D type flip-flop. To a latch signal input terminal of the latch circuit 22, a one-word period pulse from a word reset output circuit 23 at an instant corresponding to the first bit of one word mentioned above (or common terminal MSB) is supplied to latch the MSB of one word of the input data. The content of the MSB is either "0" or "1" representing the positive or negative symbol in the case of the aforementioned display of the complement of 2. Thus, the output data from the Ex.OR circuit 21 is a pure binary data representing the absolute value of the input data regardless of whether the input data is positive or negative.

In the level detection circuit 16, the output data of the Ex.OR circuit 21 is supplied through an OR circuit 24 to a data input terminal of a D type flip-flop 25, and the Q output therefrom is fed back to the aforementioned OR circuit 24. A word bit clock (hereinafter referred to as WBC) is supplied to a clock input terminal of the D type flip-flop 25, and the pulse output of the aforementioned word reset output circuit 23 is supplied to the reset or zero clear input terminal CL of the D type flip-flop 25. Thus, when the successive bit contents of one word of the input data from the MSB are all "0", the Q output is "0," but even if a single one bit is "1," this data content of "1" is fed back through an OR circuit 24 to the data input terminal, and consequently the Q output remains "1" until it is reset at the time of the appearance of the MSB of the next word. The Q output is "1" until the appearance of a "1" content bit from the MSB of one word, and after the appearance of this "1" content bit it subsequently continues to be "0."

In the case of the PCM data where one word consists of 14 bits, the 10-th bit substantially corresponds to −60 dB, and whether the level of the original waveform of the input PCM data is below −60 dB can be determined from the Q or Q̄ output at the instant of the appearance of the 10-th bit. For this reason, the Q output of the D type flip-flop 25 is coupled through an OR circuit 26 to a judgement latch circuit 27, and a pulse corresponding to the 10-th bit of one word is supplied from a pulse output circuit 29 to a latch input terminal of the judgement latch circuit 27. Thus, when it is detected that the input data is below −60 dB, the Q output from the judgement latch circuit 27 becomes "1." The judgement latch circuit 27 may be a D type flip-flop, and the pulse output from the word reset output circuit 23 is supplied to its clear input terminal.

The Q output of the judgement latch circuit 27 is supplied to a channel separation circuit section 30 which is provided for permitting the muting to be effected independently for the left and right channels. In the channel separation circuit section 30, the aforementioned Q output is supplied to two NAND circuits 31 and 32, and a rectangular wave at 44 kHz and with a duty ratio of 50% is supplied in the opposite phase relation (i.e., with a 180° phase difference) to the other input terminals of the NAND circuits 31 and 32. This can be done by supplying a 44-kHz rectangular wave with a duty ratio of 50% appearing at a terminal 33 directly to the NAND circuit 32 and also through an inverter 34 to the NAND circuit 31.

The outputs of the NAND circuits 31 and 32 are supplied to latch pulse input terminals of latch circuits 35 and 36. The muting signal is supplied to the data input terminals of these latch circuits 35 and 36. It is obtained by supplying a signal from a manually operable switch (not shown) through an input terminal 28, an inverter 37 for waveform shaping and a latch circuit 38, and its "1" level corresponds to the muting-on, and its "0" level to the muting-off. This muting signal is latched in the latch circuits 35 and 36 according to the output pulses from the NAND circuits 31 and 32.

The Q outputs from the latch circuits 35 and 36 are coupled to respective NAND circuits 41 and 42 in the aforementioned switching circuit 13 for muting. A rectangular wave signal at 44 kHz and with a duty ratio of 50% from an input terminal 43 is supplied to the NAND circuit 42 directly and to the NAND circuit 41 after inversion through an inverter 44, that is, it is supplied in the opposite phase relation to the NAND circuits as in the channel separation circuit section as mentioned above. However, the signal 44K' supplied to the input terminal 33 of the channel separation circuit section 30 leads in phase by 90° the signal 44K supplied to the input terminal 43 of the switching circuit 13. The outputs of the NAND circuits 41 and 42 constitute two inputs to a NAND circuit 45 which uses an OR circuit providing negation on the input side. In this case, the same effects may also be obtained by using AND circuits for the first stage NAND circuits 41 and 42 and OR circuits for the second stage NAND circuit 45. The output of the NAND circuit 45 is supplied to an AND circuit 46 to control the data signal supplied from the input terminal 12 to the AND circuit 46.

Thus, at the time of muting-on with the manual operation of the muting switch (not shown), a signal "1" is supplied to the data input terminals of the latch circuits 35 and 36. At this time, the input data signal supplied to the input terminal 12 is level detected for each word (corresponding to one sampled value) by the level detection circuit 16, and whether the bits from the MSB of one word up to the 10-th bit (corresponding to −60 dB) are all "0" is checked by the level detection circuit 16 and judgement latch circuit 27. When the bits up to the 10-th bit mentioned above are all "0," the Q output of the judgement latch circuit 27 becomes "1" and is supplied to the NAND circuits 31 and 32 of the channel separation circuit section 30 as such. The NAND circuits 31 and 32 operate complementarily with respect to each other depending upon whether the relevant word of the input data signal is of the left or right channel. When a level below −60 dB is detected with respect to the data of a left channel word, a latch pulse is supplied from the NAND circuit 31 to the latch circuit 35, whereby "1" is latched as the muting signal. The Q output of the latch circuit 35 (which is "0" after the aforementioned latching) is supplied to the NAND circuit 41 of the switching circuit 13, and is coupled through the NAND circuit 45 to the AND circuit 46 in synchronism to the word switching timing of the input data signal. After the aforementioned latching, the output of the NAND circuit 45 is "0" only for the left channel word period, and the output data signal supplied from the AND circuit 46 to the output terminal 14 is muted such that all the left channel word bits are zero.

It is of course to be understood that the muting is similarly effected for the right channel when the right channel word content corresponds to a level lower than −60 dB.

A time detecting circuit 17 is provided for forcibly effecting the muting after the lapse of a constant period of time from the instant of change of the muting signal mentioned above (i.e., from the instant of change from "0" to "1" or from "1" to "0"). To detect the change of signal accompanying the muting operation coupled to the input terminal 28, the input and output signals to and from, for instance, the latch circuit 38 are supplied to the Ex.OR circuit 48. The output of the Ex.OR circuit 48 is coupled through an inverter 49 to the clear terminal CL of a time counting circuit 47, and the output signal of "1" from the time counting circuit 47 is supplied to the OR circuit 26. The time counting circuit 47 may be constructed using a shift register, through which the input data can be progressively shifted according to a clock pulse signal of a constant cycle period (for instance 16 msec.). With an 8-bit shift register, a measurable time range up to 128 msec. can be provided. In other words, if the aforementioned zero level (i.e., level below −60 dB) is not detected until a period of 128 msec. has elapsed from the instant when the muting mode is brought about, the output "1" of the time counting circuit 47 is coupled through OR circuit 26 to the judgement latch circuit 27 to forcibly effect the muting operation as described previously.

In the instant embodiment, the detection of overflow is simultaneously made when the peak of the aforementioned waveform level or data exceeds 14 bits.

More particularly, a binary data representing the absolute value of the input data from the Ex.OR circuit 21 is supplied through an inverter 51 to an OR circuit 52 of the peak detection circuit 19, and in the peak detection circuit 19 whether "1" is present as a bit content in one word is detected through the feedback of the output of the OR circuit 52 through a latch circuit 53 to the OR circuit 52. This corresponds to the detection as to whether "0" is present in the bit content of one word as the output data from the Ex.OR circuit 21, and if a "0" bit is detected, the Q output of the latch circuit 53 is subsequently held at "1." The Q output of the latch circuit 53 is supplied to a peak judgement latch circuit 54, to which a latch pulse is supplied from a pulse output circuit 29 for the 14-th bit of one word. Thus, when the output data from the Ex.OR circuit 21 up to the LSB (i.e., 14-th bit) are all "1," the Q output of the judgement latch circuit 54 becomes "1," and a peak detection signal (or overflow detection signal) is supplied through the channel separation circuit section 56 to the output terminal 55. The channel separation circuit section 56 includes two NAND circuits 57 and 58 and an AND circuit 59. The two NAND circuits 57 and 58, like the aforementioned channel separation circuit section 30, are gate controlled by 44-kHz opposite-phase rectangular signals.

As has been described in the foregoing, the muting circuit according to the present invention comprises a switching circuit connected between input and output terminals and a muting control circuit for controlling the switching operation of the switching circuit according to the muting signal, and the waveform level of the input signal from the input terminal is detected and the switching operation of the switching circuit is caused according to the muting operation at an instant when a zero level is approached by the muting signal.

Thus, in contrast to the prior art muting circuits in which click noises or other noise results from the fact that the muting is brought about at an instant when the signal waveform is not zero as shown in FIG. 1B, with the construction according to the present invention the muting is brought about at an instant when the signal waveform crosses the zero level as shown in FIG. 1C, thus eliminating the generation of the aforementioned noise.

Another feature of the present invention resides in that the muting control circuit in the muting circuit having the aforementioned feature causes the switching operation of the switching circuit on the basis of the relation between the time elapsed from the instant of change of the muting signal and the waveform level of the input signal.

Thus, even in case when the zero level detection cannot be made in case when a direct current level is introduced into the input audio signal, the muting can be forcibly brought about or released.

The above embodiment of the present invention is by no means limitative, and various changes and modifications can be made without departing from the scope and spirit of the present invention.

What is claimed is:

1. A digital muting circuit comprising, an input terminal for receiving a PCM signal having words of plural bits, an output terminal for deriving said PCM signal, a controlling circuit for generating a muting signal, a detecting circuit for examining the bit pattern of said PCM signal to produce a detected signal when the signal level of the waveform corresponding to said PCM signal is less than a predetermined value, and switching means connected between said input terminal and said output terminal and for replacing said PCM signal with a PCM signal having a bit pattern representing the zero level by receiving said detected signal while said muting signal is generated.

2. A digital muting circuit according to claim 1, further comprising time counting means for counting a predetermined time elapsed from the instant of change of said muting signal and for producing a switching signal so as to cause the switching operation of said switching means on the basis of the relationship between the time elapsed from the instant of change of said muting signal and the waveform level of said input signal.

* * * * *